(12) United States Patent
Xu et al.

(10) Patent No.: US 11,793,030 B2
(45) Date of Patent: Oct. 17, 2023

(54) DISPLAY PANEL AND MANUFACTURING METHOD THEREOF, AND DISPLAY DEVICE

(71) Applicant: BOE TECHNOLOGY GROUP CO., LTD., Beijing (CN)

(72) Inventors: Sheng Xu, Beijing (CN); Shipei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 191 days.

(21) Appl. No.: 17/221,912

(22) Filed: Apr. 5, 2021

(65) Prior Publication Data
US 2022/0085332 A1   Mar. 17, 2022

(30) Foreign Application Priority Data

Sep. 16, 2020 (CN) .......................... 202010975115.8

(51) Int. Cl.
| | |
|---|---|
| *H10K 50/858* | (2023.01) |
| *H01L 27/15* | (2006.01) |
| *H10K 59/122* | (2023.01) |
| *H10K 71/00* | (2023.01) |
| *H10K 59/12* | (2023.01) |

(52) U.S. Cl.
CPC ......... *H10K 50/858* (2023.02); *H01L 27/156* (2013.01); *H10K 59/122* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 11,163,183 B2* | 11/2021 | Liou | G02F 1/1323 |
| 11,404,674 B2* | 8/2022 | Pan | G02B 3/0062 |
| 2018/0012069 A1* | 1/2018 | Chung | G06V 40/1365 |
| 2019/0080138 A1* | 3/2019 | Gao | G02B 3/0031 |
| 2020/0251689 A1* | 8/2020 | Pan | H01L 27/322 |
| 2021/0286963 A1* | 9/2021 | Gao | G06V 40/1318 |

* cited by examiner

*Primary Examiner* — Michelle Mandala
(74) *Attorney, Agent, or Firm* — XSENSUS LLP (57) ABSTRACT

The present disclosure relates to the field of display technology, and proposes a display panel, a manufacturing method thereof, and a display device. The display panel includes an array substrate, a plurality of sub-pixels, and a plurality of divergent lenses. The array substrate includes a plurality of switch units. The plurality of sub-pixels is arranged on the array substrate, where each sub-pixel includes a plurality of light-emitting components, each light-emitting component includes a driving electrode, the driving electrode is connected to the plurality of switch units, and a gap exists between the driving electrodes of two adjacent light-emitting components. Each divergent lens is arranged on a side of a respective gap away from the array substrate. An orthographic projection of the gap on the array substrate is located in an orthographic projection of the divergent lens on the array substrate.

16 Claims, 5 Drawing Sheets

| S10 | providing an array substrate, wherein the array substrate comprises a switch array including a plurality of switch units. |

| S20 | forming a plurality of sub-pixels on the array substrate, wherein each sub-pixel comprises a plurality of light-emitting components, each light-emitting component comprises a driving electrode, the driving electrode is connected to the plurality of switch units, and a gap exists between driving electrodes of two adjacent light-emitting components. |

| S30 | forming a divergent lens on a side of each gap away from the array substrate, wherein an orthographic projection of the gap on the array substrate is located in an orthographic projection of the divergent lens on the array substrate. |

DISPLAY PANEL AND MANUFACTURING METHOD THEREOF, AND DISPLAY DEVICE

CROSS-REFERENCE TO RELATED APPLICATION(S)

The present application claims the benefit of and priority to Chinese Patent Application No. 202010975115.8 filed on Sep. 16, 2020, the disclosure of which is incorporated herein by reference in its entirety for all purposes.

TECHNICAL FIELD

The present disclosure relates to the field of display technology and, in particular, to a display panel, a method manufacturing for the display panel, and a display device including the display panel.

BACKGROUND

With the development of display technology, flat display technology is becoming more mature. In order to provide users with an immersive experience, 3D display technology has gradually entered everyone's field of vision. At present, 3D display technology can be grouped into two types: naked eye type, and glasses type. Among them, the glasses type of 3D technology is relatively mature in the consumer market. To achieve the glasses-style 3D display, dual lenses are needed when shooting. The distance between the two lenses usually needs to be 6 cm to simulate the observation of human eyes, so that the left and right eye signals are stored separately. During playback, the two signals are played separately at the same time, and the left and right eyes receive separately to achieve 3D display effect. The naked-eye 3D display technology is still in the development process. The current main implementations can be grouped into parallax barrier type, lenticular lens type, pointing light source type, and multi-layer display type. The above display implementations have their own advantages and disadvantages, but the structure usually needs to be set separately, which will significantly increase the panel in thickness.

The light field 3D display technology is one of the naked-eye 3D display technologies. It uses sub-pixel islands to realize the light field 3D display technology. Compared with conventional 3D display panels, it directly integrates the display components into the panel, making the display thinner and lighter, and also energy saving. However, the existing light field 3D display panel is prone to problems such as black edges visible to the naked eye.

The above-mentioned information disclosed in the Background section is only used to strengthen the understanding of the background of the present disclosure. Therefore, it may include information that does not constitute the prior art known to those of ordinary skill in the art.

SUMMARY

According to an aspect of the present disclosure, there is provided a display panel, including:
an array substrate, including a plurality of switch units;
a plurality of sub-pixels, arranged on the array substrate, wherein each sub-pixel includes a plurality of light-emitting components, each light-emitting component includes a driving electrode, the driving electrode is connected to the plurality of switch units of the array substrate, and a gap exists between the driving electrodes of two adjacent light-emitting component; and
a plurality of divergent lenses, wherein each divergent lens is provided on a side of a respective gap away from the array substrate, and an orthographic projection of the gap on the array substrate is located in an orthographic projection of the divergent lens on the array substrate.

In an exemplary embodiment of the present disclosure, the side of each divergent lens close to the array substrate is a flat surface, and the side of each divergent lens away from the array substrate is an arc surface.

In an exemplary embodiment of the present disclosure, in the thickness direction of the array substrate, the distance between the side of each divergent lens close to the respective driving electrode and the side of the respective driving electrode close to the divergent lens is greater than or equal to the focal length of the divergent lens.

In an exemplary embodiment of the present disclosure, in the thickness direction of the array substrate, the distance between the side of each divergent lens close to the respective driving electrode and the side of the respective driving electrode close to the divergent lens is less than or equal to twice the focal length of the divergent lens.

In an exemplary embodiment of the present disclosure, the display panel further includes: a second planarization layer, disposed on a side of the plurality of divergent lenses away from the array substrate.

In an exemplary embodiment of the present disclosure, each sub-pixel further includes:
a pixel definition layer, arranged on the side of the driving electrodes of the plurality of light-emitting components away from the array substrate, and the pixel definition layer is provided with a second via hole to expose the driving electrodes of the plurality of light-emitting components;
a light-emitting layer, arranged in the second via hole and connected to the driving electrodes of the plurality of light-emitting components;
a second electrode, arranged on a side of the light-emitting layer away from the array substrate; and
a group of protective layers, arranged on the side of the second electrode away from the array substrate.

In an exemplary embodiment of the present disclosure, the light-emitting layer includes a plurality of light-emitting parts, and each light-emitting part is connected to the driving electrode of a respective light-emitting component.

In an exemplary embodiment of the present disclosure, the group of protective layers comprises a group of encapsulation layers.

In an exemplary embodiment of the present disclosure, the array substrate includes:
a base substrate;
a buffer layer, provided on the base substrate;
an active layer, provided on the side of the buffer layer away from the base substrate;
a gate insulating layer, provided on a side of the active layer away from the base substrate, wherein a third via hole is provided in the gate insulating layer to expose the active layer;
a gate electrode, arranged on the side of the gate insulating layer away from the base substrate;
an interlayer dielectric layer, provided on a side of the gate electrode away from the base substrate, wherein the interlayer dielectric layer is provided with a fourth via hole that communicates with the third via hole; and
source and drain electrodes, arranged on a side of the interlayer dielectric layer away from the base substrate, wherein the source and drain electrodes are connected to the active layer through the fourth via hole and the third via hole; and a first planarization layer, provided on a side of the source and drain electrodes away from the base substrate, wherein a plurality of first via holes is provided in the first planarization layer.

In an exemplary embodiment of the present disclosure, the orthographic projection of each gap on the array substrate is located in the middle area of the orthographic projection of the respective divergent lens on the array substrate.

According to an aspect of the present disclosure, there is provided a manufacturing method for a display panel, including:

providing an array substrate, the array substrate including a plurality of switch units;

forming a plurality of sub-pixels on the array substrate, wherein each sub-pixel includes a plurality of light-emitting components, each light-emitting component includes a driving electrode connected to the plurality of switch units of the array substrate, and a gap exists between the driving electrodes of two adjacent light-emitting components; and forming a divergent lens on the side of each gap away from the array substrate, wherein the orthographic projection of the gap on the array substrate is located in the orthographic projection of the divergent lens on the array substrate.

In an exemplary embodiment of the present disclosure, the divergent lens is formed by a nano-imprinting process.

According to an aspect of the present disclosure, there is provided a display device, including:

a display panel as described in any one of the above embodiments.

BRIEF DESCRIPTION OF THE DRAWINGS

The above-mentioned and other features and advantages of the present disclosure will become more apparent by describing in detail the exemplary embodiments thereof with reference to the accompanying drawings.

DETAILED DESCRIPTION OF THE EMBODIMENTS

Example embodiments will now be described more fully with reference to the accompanying drawings. However, the example embodiments can be implemented in various forms, and should not be construed as being limited to the embodiments set forth herein. On the contrary, these embodiments are provided so that the present disclosure will be comprehensive and complete, and fully convey the concept of the example embodiments to those skilled in the art. The same reference numerals in the figures indicate the same or similar structures, and thus their detailed descriptions will be omitted.

The reference signs for the main components in the figures are explained as follows:

1, substrate; 2, array substrate; 21, buffer layer; 22, active layer; 23, gate insulating layer; 24, gate electrode; 25, interlayer dielectric layer; 26, source electrode; 27, drain electrode; 3, first planarization layer; 4, light-emitting component; 41, driving electrode; 42, pixel definition layer; 43, light-emitting layer; 44, second electrode; 5, group of protective layers; 6, divergent lens; 7, second planarization layer; 81, red sub-pixel; 82, red light-emitting component; 83, green sub-pixel; 84, green light-emitting component; 85, blue sub-pixel; 86, blue light-emitting component; 9, eyes; 101, first via hole; 102, second via hole; 103, third via hole; 104, fourth via hole; 11, imprint template; 111, curved surface portion; and 112, flat surface portion.

Figure 1:
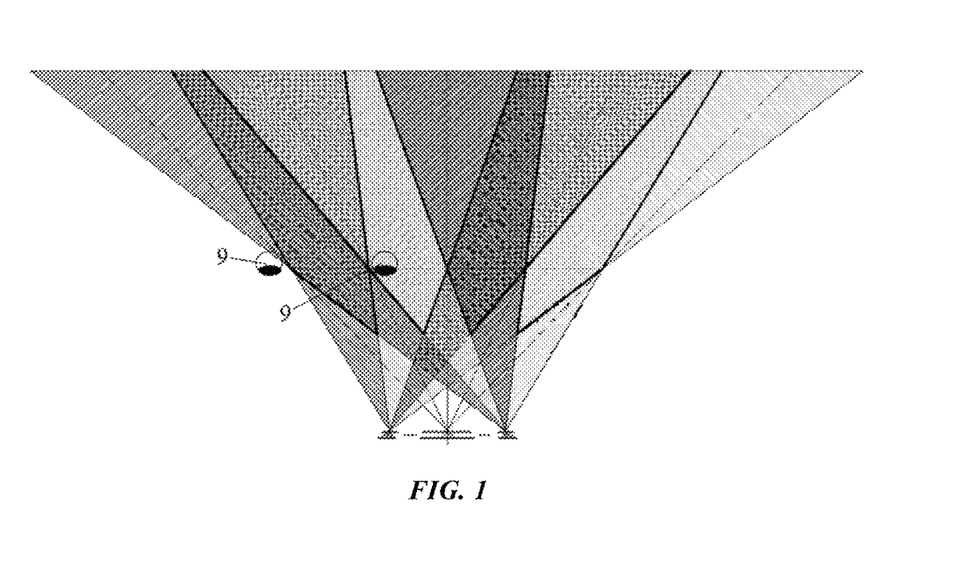
FIG. 1 is a schematic principle diagram of the light field 3D display technology.

Referring to the schematic diagram shown in FIG. 1, the specific principle is that light emitted by R, G, and B sub-pixels is passed through a cylindrical lens to form a specific light field. When the human eye is at a specific position, the left and right eyes 9 respectively accept two display images from different light fields. If the two images have a certain parallax during shooting, a 3D display effect can be formed in the human brain. The eye 9 in the figure is located at the best viewing distance.

Figure 2:
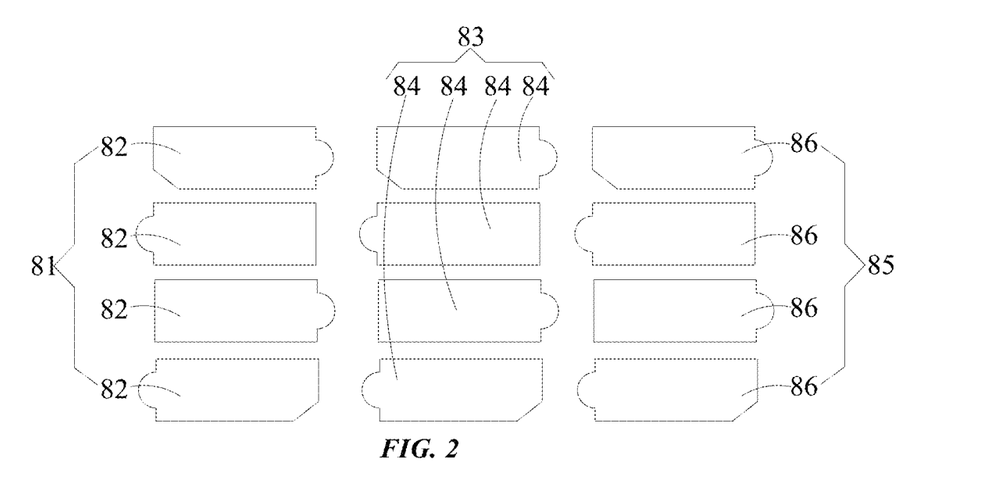
FIG. 2 is a schematic split structural diagram of sub-pixels in the light field 3D display technology.
Figure 3:
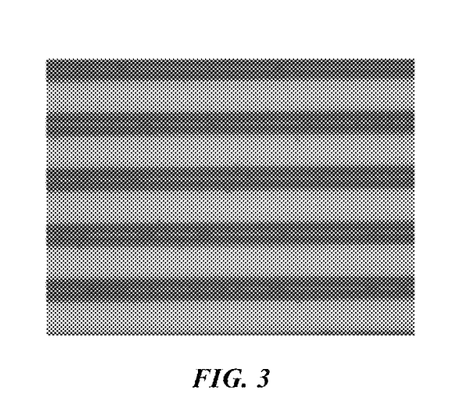
FIG. 3 is a schematic display effect of the black edges generated by the anode.

To achieve the above display effects, the sub-pixels in the display panel need to be further divided, so that the panel that can only display one screen in the ordinary display can display at least two, and the original sub-pixels need to be further divided to form multiple light-emitting components. As shown in FIG. 2, the red sub-pixel 81 is split to form four red light-emitting components 82, the green sub-pixel 83 is split to form four green light-emitting components 84, and the blue sub-pixel 85 is split to form four blue light-emitting components 86. This puts forward higher requirements for the manufacturing process of the display panel, especially photolithography. In order to manufacture a display panel that meets the requirements, the manufacture of the anode is particularly critical. Under the premise of ensuring that the anodes are disconnected and non-conductive, the gap L between the anodes should be reduced as much as possible. When the gap L between the anodes is large, the problem of black edges visible to the naked eye will occur. As shown in FIG. 3, the existing forming process for anode cannot meet the above requirements.

It is generally believed that when the gap L between the anodes is less than 1.0 um, it will not be recognized by the naked eye in the display. The manufacture method for anode is to directly perform photolithography on a single photomask. The gap L between the anodes is completely controlled by the processing capability of the lithography machine. At present, the processing capability of the lithography machine in the industry is usually about 2 um, and it becomes a bottleneck to make further reductions.

Figure 4:
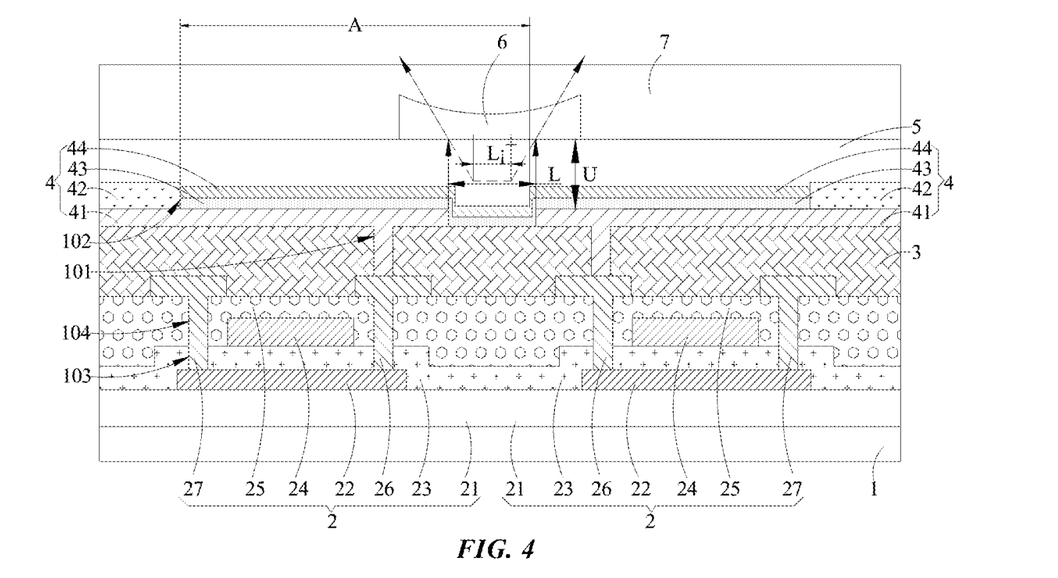
FIG. 4 is a schematic structural diagram of a display panel according to an exemplary embodiment of the present disclosure.

An example embodiment of the present disclosure provides a display panel, referring to the schematic structural diagram of the display panel according to an example embodiment of the present disclosure shown in FIG. 4. The display panel includes an array substrate 2, a plurality of sub-pixels, and a plurality of divergent lenses 6. The substrate 2 includes a switch array formed by a plurality of switch units. The plurality of sub-pixels is provided on the array substrate 2, and the sub-pixels include a plurality of light-emitting components 4. The light-emitting components 4 include driving electrodes 41, and the driving electrodes 41 are connected to the switch units of the array substrate 2. Additionally, there is a gap L between the driving electrodes 41 of two adjacent light-emitting components 4. A plurality of divergent lenses 6 are arranged on a side of the gap L away from the array substrate 2, and the orthographic projection of the gap L on the array substrate 2 is located in the orthographic projection of the divergent lens 6 on the array substrate 2.

The display panel according to an exemplary embodiment of the present disclosure uses the principle of imaging reduction by the divergent lens 6, so as to further reduce, through optical imaging, the gap L of 2.0 um manufactured by the original process limit, thus forming a reduced virtual image L'. Finally, a seamless display is achieved that cannot be recognized by the naked eye. In this way, the appearance of black edges is avoided and the display effect is improved.

In an exemplary embodiment of the present disclosure, description is made by taking as an example that one sub-pixel is divided to form two light-emitting components 4. Of course, in other example embodiments of the present disclosure, one sub-pixel may be divided to form three, four, or more light-emitting components 4.

In an exemplary embodiment, the array substrate 2 is a top-gate thin-film transistor (TFT) array substrate 2. Specifically, the array substrate 2 may include a base substrate 1, a buffer layer 21, an active layer 22, a gate insulating layer 23, a gate electrode 24, an interlayer dielectric layer 25, source and drain electrodes, and a first planarization layer 3.

In an exemplary embodiment, the base substrate 1 may be a glass substrate. Of course, it may also be a flexible substrate, for example, polyimide resin. The buffer layer 21 is provided on the base substrate 1. The active layer 22 is provided on the side of the buffer layer 21 away from the base substrate 1. The gate insulating layer 23 is provided on the side of the active layer 22 away from the base substrate 1. The gate insulating layer 23 is provided with a third via hole 103 to expose part of the active layer 22. The gate electrode 24 is provided on the side of the gate insulating layer 23 away from the base substrate 1. The interlayer dielectric layer 25 is provided on the side of the gate electrode 24 away from the base substrate 1. The interlayer dielectric layer 25 is provided with a fourth via hole 104 communicating with the third via hole 103. The third via hole 103 and the fourth via hole 104 are formed by the same patterning process. The source electrode 26 and the drain electrode 27 are provided on the side of the interlayer dielectric layer 25 away from the base substrate 1. The source electrode 26 is connected to the active layer 22 through the fourth via hole 104 and the third via hole 103. Of course, it may also be that the drain electrode 27 is connected to the active layer 22 through the fourth via hole 104 and the third via hole 103.

In an exemplary embodiment, a first planarization layer 3 is provided on the side of the source electrode 26 and the drain electrode 27 away from the base substrate 1, and a first via hole 101 is provided in the first planarization layer 3. The first via hole 101 exposes the source electrode 26 of the array substrate 2. Of course, the drain electrode 27 can also be exposed.

Understandably, in other exemplary embodiments of the present disclosure, the array substrate 2 may also be a bottom-gate type TFT array substrate or a double-gate type TFT array substrate, etc., which will not be described one by one herein.

A gate electrode 24, an active layer 22, a source electrode 26, and a drain electrode 27 form a thin film transistor, that is, a switch unit, and a plurality of switch units controls a light-emitting component 4. The plurality of switch units of the plurality of light-emitting parts 4 forms a switch array.

In an example embodiment, a plurality of sub-pixels are provided on the side of the first planarization layer 3 away from the base substrate 1. One sub-pixel may include two light-emitting components 4. That is, two light-emitting components 4 may form one sub-pixel. It can be blue. Of course, it can also be red or green.

Specifically, one sub-pixel may include two driving electrodes 41, a pixel definition layer 42, a light-emitting layer 43, a second electrode 44, and a group of protective layers 5. The driving electrodes 41 are provided on the side of the first planarization layer 3 away from the base substrate 1, and the two driving electrodes 41 are respectively connected to the source electrode 26 of the array substrate 2 through the first via hole 101. A gap L exists between the driving electrodes 41 of two adjacent light-emitting components 4. The pixel definition layer 42 is provided on the side of the driving electrodes 41 away from the base substrate 1, and the pixel definition layer 42 is provided with a second via hole 102 to expose the driving electrodes 41 of the two light-emitting components 4. That is, the driving electrode 41 of the two light-emitting components 4 can be exposed through a second via hole 102. The light-emitting layer 43 is provided in the second via hole 102 on the pixel definition layer 42, and is connected to the two exposed driving electrodes 41. That is, two driving electrodes 41 share one light-emitting layer 43. Of course, in other exemplary embodiments of the present disclosure, the light-emitting layer 43 may also be provided separately. The second electrode 44 is provided on the side of the light-emitting layer 43 away from the base substrate 1. The driving electrode 41 may be an anode, and accordingly, the second electrode 44 may be a cathode.

Figure 6:
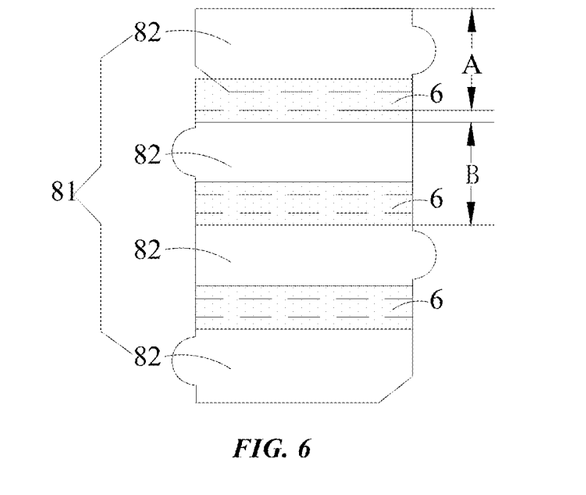
FIG. 6 is a schematic top view of the positional relationship between a light-emitting component and a divergent lens of a display panel according to another exemplary embodiment of the present disclosure.

In an exemplary embodiment, two light-emitting components 4 are arranged side by side to form a sub-pixel, and the distance between the two light-emitting components 4 is about 9 micrometers. That is, the distance between the center points of the two light-emitting components 4 is 9 micrometers, or the distance A between the side edges at the same side of the two light-emitting components 4 is 9 micrometers. A gap L is formed between the two light-emitting components 4. The width of the gap L may be the distance between the two side surfaces where the driving electrodes 41 of the two light-emitting components 4 are close to each other. In the case where the two light-emitting components 4 are not misaligned, the length of the gap L may be the same as the length of the light-emitting component 4, and the length direction is substantially perpendicular to the width direction. In the case where the two light-emitting components 4 are misaligned, the length of the gap L refers to the length of a portion having the driving electrode 41 on both sides of the gap L. Of course, it can be understood that, referring to FIG. 6, when one sub-pixel is divided to form four light-emitting components 4, three gaps L are formed between the four light-emitting components 4, and the number of the gaps L is greater than that of the light-emitting components 4 by one. Also, the distance between two adjacent gaps L is the same as the distance A between two light-emitting components 4, which can be 9 microns. That is, the distance between the side edges at the same side of two adjacent gaps L is 9 microns. That is, the arrangement period of the light-emitting components 4 is the same as the arrangement period of the gaps L. After the divergent lens 6 is subsequently formed, the distance B between the side edges at the same side of two adjacent divergent lenses 6 can also be 9 micrometers. That is, the arrangement period of the divergent lenses 6 is the same as the arrangement period of the gaps L.

A group of protective layers 5 is provided on the side of the plurality of light-emitting components 4 away from the base substrate 1. In an exemplary embodiment, the group of protective layers 5 is a group of encapsulation layers, which may specifically include an inorganic layer, an organic layer, and the like that are stacked over each other.

Of course, in other exemplary embodiments of the present disclosure, the group of protective layers 5 may include only one layer. For example, it may be a transparent passivation layer, a planarization layer, or the like.

A divergent lens 6 is provided on the side of the group of protective layers 5 away from the base substrate 1, and the number of divergent lenses 6 is the same as the number of the gaps L between the driving electrodes 41. The orthographic projection of the gap L on the base substrate 1 is located in the orthographic projection of the divergent lens 6 on the base substrate 1, and the orthographic projection of the gap L on the base substrate 1 occupies a middle area of the orthographic projection of the divergent lens 6 on the base substrate 1. Thus, problems can be avoided such as distortion and aberration caused by the gap L overlapping with the edge of the divergent lens 6. In other exemplary embodiments of the present disclosure, when three light-emitting components 4 are provided and two gaps L are formed, two divergent lenses shall be provided, and the orthographic projection of the gap L on the base substrate 1 shall be located in the orthographic projection of the divergent lens 6 on the base substrate 1. That is, the gap L and the divergent lens 6 may have a one-to-one correspondence.

Figure 5:
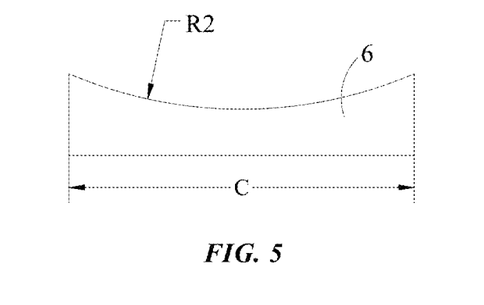
FIG. 5 is a schematic dimensioning diagram of the divergent lens in FIG. 4.

In an exemplary embodiment, the side of the divergent lens 6 close to the group of protective layers 5 is a flat surface, and the side of the divergent lens 6 away from the group of protective layers 5 is an arc surface. Referring to FIG. 5, the radius of curvature of the arc surface is approximately 5 microns. The width C of the divergent lens 6 is about 4 microns, and the length of the divergent lens 6 is the same as the length of the gap L. Of course, the length of the divergent lens 6 can also be greater than the length of the gap L. The width direction of the divergent lens 6 coincides with the width direction of the gap L, and the length direction of the divergent lens 6 coincides with the length direction of the gap L. In other exemplary embodiments of the present disclosure, the side of the divergent lens 6 away from the group of protective layers 5 may be a curved surface composed of multiple regular polygons.

In an exemplary embodiment, the thickness of the group of protective layers 5 is 10 microns. That is, the vertical distance between the side of the divergent lens 6 close to the base substrate 1 and the side of the driving electrodes 41 away from the base substrate 1 is 10 micron. That is, the object distance is 10 microns.

In an exemplary embodiment, the vertical distance U between the side of the driving electrodes 41 close to the divergent lens 6 and the side of the divergent lens 6 close to the driving electrodes 41 is greater than or equal to the focal length of the divergent lens 6, and also less than or equal to twice the focal length of the divergent lens 6. Even then the gap L is between the focal lengths and twice the focal length of the divergent lens 6, that is, the object distance is greater than or equal to the focal length of the divergent lens 6 and less than or equal to twice the focal length of the divergent lens 6. More than twice the focal length makes the object distance larger, and the thickness of the group of protective layers 5 needs to be thicker, which is not conducive to the light and thin design of the display panel. The object distance will be too small if it is chosen to be less than the focal length, which is not beneficial for the seamless display effect. Of course, in the case where the thickness of the display panel can be designed to be thicker, the vertical distance U between the side of the driving electrodes 41 close to the divergent lens 6 and the side of the divergent lens 6 close to the driving electrodes 41 can be greater than or equal to twice the focal length of the divergent lens 6.

In an exemplary embodiment, the focal length formula for lens $1/f=(N-1)(1/R1+1/R2)$ can be used to calculate the radius of curvature of the divergent lens 6, where f is the focal length of the divergent lens 6, N is the refractive index of the divergent lens 6, which can be 1.5, R1 is the radius of curvature for the side of the divergent lens 6 close to the group of protective layers 5 (since it is a plane, the value of R1 can be $\infty$), and R2 is the radius of curvature for the curved surface on the side of the divergent lens 6 away from the group of protective layers 5. When the focal length f takes the maximum value, which is equal to the object distance (i.e., the distance between the side of the divergent lens 6 close to the base substrate 1 and the side of the driving electrodes 41 away from the base substrate 1) of 10 microns, the radius of curvature R2 for the curved surface on the side of the divergent lens 6 away from the group of protective layers 5 can be calculated as 5 microns. Of course, in other exemplary embodiments of the present disclosure, the thickness of the group of protective layers 5 and the radius of curvature R2 of the divergent lens 6 can be specifically set as required.

Since the manufacturing method of the anode is to directly perform photolithography with a single photomask, the gap L between the anodes is completely controlled by the processing capability of the photoetching machine. At present, the processing capability of the optical machine in the industry is usually about 2.0 um. When the gap L between the anodes is less than 1.0 um, it will not be recognized by the naked eye in the display. Therefore, for the divergent lens 6, the minimum gap L as the object is 2.0 um, and the maximum image formed by the gap L through the divergent lens 6 is 1.0 um. Thus, the maximum ratio of the image distance to the object distance can be obtained as ½, according to the imaging formula of the divergent lens 6:

$$1/u+1/f=1/v,$$

where f is the focal length of the divergent lens 6, u is the object distance, and v is the image distance. Through the above formula, it can be found that the focal length of the divergent lens 6 is less than or equal to the distance between the side of the divergent lens 6 close to the base substrate 1 and the side of the driving electrode 41 away from the base substrate 1. Thus, the object distance needs be greater than or equal to the focal length of the divergent lens 6, and the reduction factor cannot be met if the object distance is less than the focal length of the divergent lens 6.

In an exemplary embodiment, a second planarization layer 7 is provided on the side of the plurality of divergent lenses 6 away from the base substrate 1, and the second planarization layer 7 can protect the divergent lenses 6.

Further, the present disclosure also provides a method for manufacturing a display panel. Referring to the schematic flowchart of the method for manufacturing a display panel according to an exemplary embodiment of the present disclosure shown in FIG. 7, the manufacturing method may include the following steps.

Figure 7:
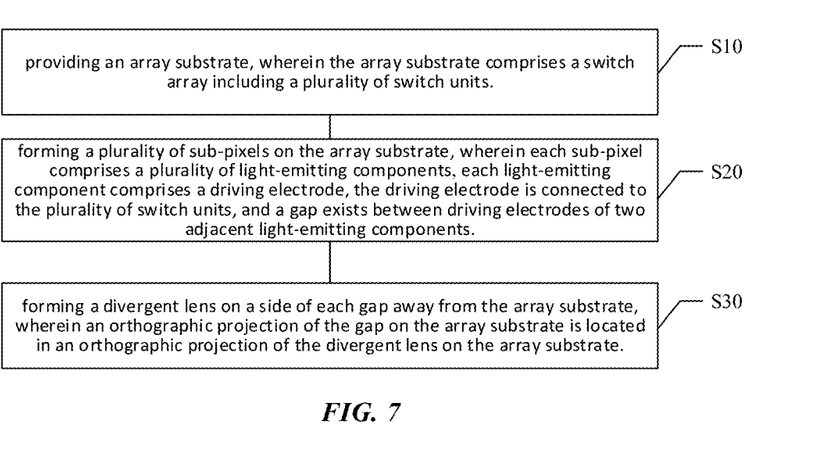
FIG. 7 is a schematic flow diagram of a manufacturing method for a display panel according to an exemplary embodiment of the present disclosure.

In step S10, an array substrate is provided, and the array substrate includes a switch array formed by a plurality of switch units.

In step S20, a plurality of sub-pixels is formed on the array substrate, wherein each sub-pixel includes a plurality of light-emitting components, each of the light-emitting components includes a driving electrode, the driving electrode is connected to the plurality of switch units of the array substrate, and there is a gap between the driving electrodes of two adjacent light-emitting components.

In step S30, a divergent lens is formed on the side of each gap away from the array substrate, and the orthographic projection of the gap on the array substrate is located within the orthographic projection of the divergent lens on the array substrate.

Figure 8:
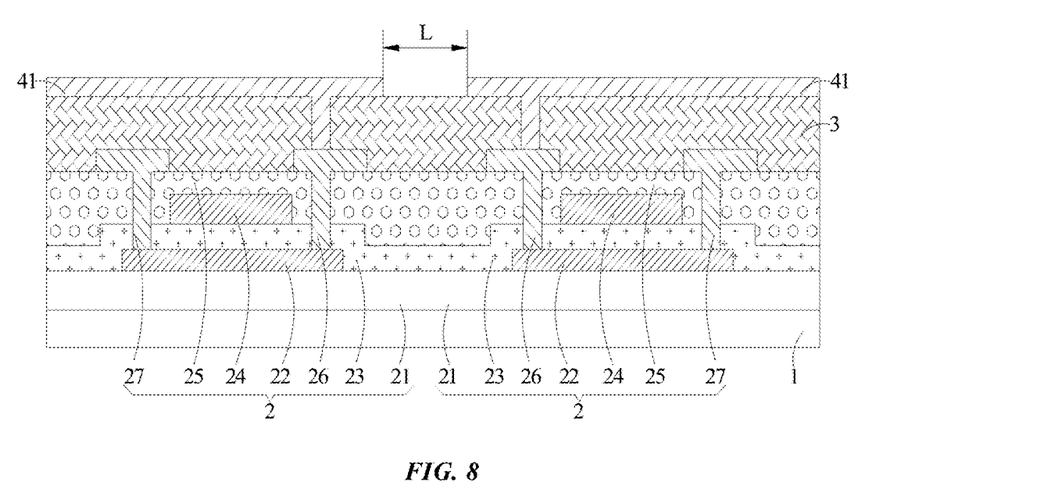
FIG. 8 is a schematic diagram of the structure after an array substrate and driving electrodes are formed on a base substrate.
Figure 9:
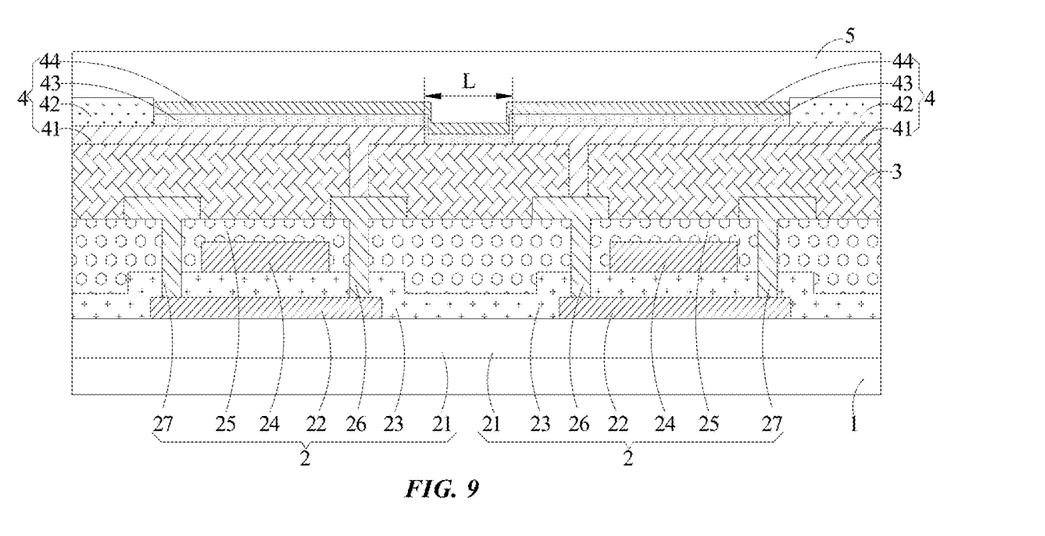
FIG. 9 is a schematic diagram of the structure after the light-emitting components and a group of protective layers are formed on the basis of FIG. 8.

In an exemplary embodiment, referring to the schematic diagram of the structure after the array substrate 2 and the driving electrodes 41 are formed on the base substrate 1 shown in FIG. 8, a gap L is formed between the driving electrodes 41 in the figure. Refer to FIG. 9 for a schematic structural diagram after the light-emitting components 4 and the group of protective layers 5 are formed on the basis of FIG. 8. The method for forming the array substrate 2, the method for forming the light-emitting components 4, and the method for forming the group of protective layers 5 can adopt methods in the prior art, and will not be repeated herein. The driving electrode 41 is directly formed by photolithography through a single photomask, and the width of the gap L is greater than or equal to 2 micrometers.

Figure 10:
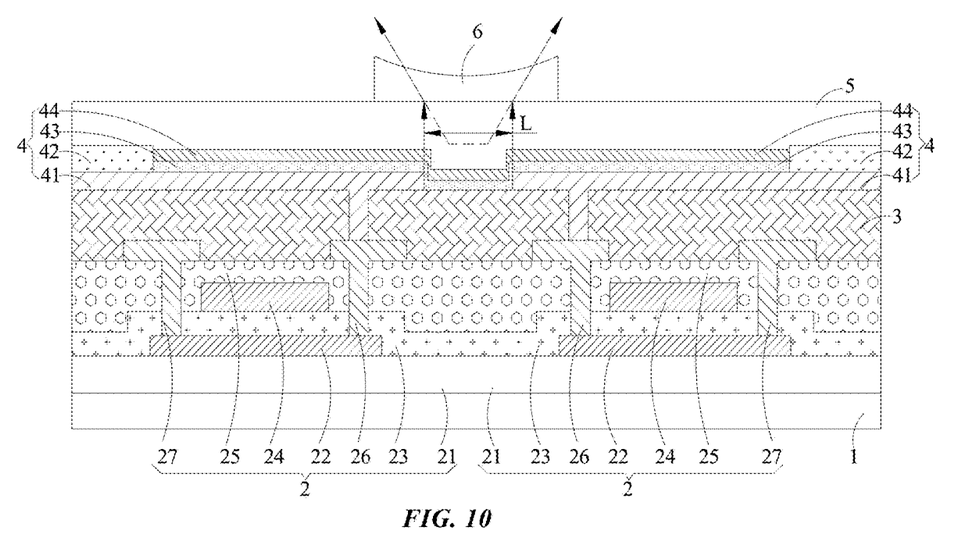
FIG. 10 is a schematic diagram of the structure after the divergent lenses are formed on the basis of FIG. 9.

In an exemplary embodiment, refer to the schematic diagram of the structure shown in FIG. 10 after the divergent lens 6 is formed on the basis of FIG. 8. The divergent lens 6 can be formed by a nano-imprinting process. The material of the divergent lens 6 can be nano-imprinted rubber with a refractive index of about 1.5. Specifically, the group of protective layers 5 is coated with tackifier on the side away from the base substrate 1. The side of the tackifier away from the base substrate 1 is spin-coated to form a material layer for divergent lens, which is baked, laminated through an imprint template, and cured by ultraviolet radiation. Then, the imprint template is removed to form the divergent lens 6.

Figure 11:
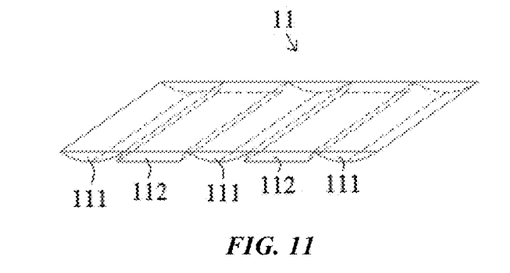
FIG. 11 is a schematic structural diagram of an imprint template used in the present disclosure.

Referring to the structural schematic diagram of the imprint template shown in FIG. 11, the imprint template 11 includes a curved portion 111 and a flat portion 112. The material layer for divergent lens is imprinted by the curved portion 111 to form the divergent lens 6, and the material layer for divergent lens is imprinted by the flat portion 112 to remove the material layer for divergent lens, helping to form a gap between the divergent lenses 6.

In an exemplary embodiment, refer to the schematic diagram of the structure shown in FIG. 4 after the second planarization layer 7 is formed on the basis of FIG. 10. The material of the second planarization layer 7 is Over Coating (OC) glue.

Furthermore, the present disclosure also provides a display device. The display device may include the display panel described in any one of the above items. The structure of the display panel has been described in detail above, so it will not be repeated herein.

The specific type of the display device is not particularly limited. The types of display devices commonly used in the field can be used, such as mobile devices such as mobile phones, wearable devices such as watches, VR devices, etc. Choices can be made according to the specific use of the display device, and thus it will not be repeated herein.

It should be noted that, in addition to the display panel, the display device also includes other necessary components. Take the display as an example, components such as housing, circuit board, power cord, etc. can be also comprised. The specific usage requirements shall be supplemented accordingly, and will not be repeated herein.

Compared with the prior art, the beneficial effects of the display device provided by exemplary embodiments of the present disclosure are the same as the beneficial effects of the display panel provided by the above-mentioned exemplary embodiments, and will not be repeated herein.

The features, structures, or characteristics described above can be combined in one or more embodiments in any suitable manner. If possible, the features discussed in the above embodiments are interchangeable. In the above description, many specific details are provided to give a sufficient understanding of embodiments of the present disclosure. However, those skilled in the art will realize that the technical solutions of the present disclosure can be practiced without one or more of the specific details, or other methods, components, materials, etc. can be used. In other cases, well-known structures, materials, or operations are not shown or described in detail to avoid obscuring aspects of the present disclosure.

The term "about" and "approximately" used in the present specification usually means within 20% of a given value or range, preferably within 10%, and more preferably within 5%. The quantity given here is an approximate quantity, which means that the meaning of "about", "approximately", "roughly" and "more or less" can still be implied in the absence of specific instructions.

Although relative terms such as "upper" and "lower" are used in the present specification to describe the relative relationship between one component and another component, these terms are used in the present specification only for convenience, for example, used based on the direction of the example as shown in the drawings. It can be understood that if the device is turned over and turned upside down, the component described as being "upper" will become "lower". Other relative terms, such as "high", "low", "top", and "bottom" have similar meanings. When a structure is "on" another structure, it may mean that a certain structure is integrally formed on another structure, or that a certain structure is "directly" installed on another structure, or that a certain structure is "indirectly" installed on another structure through other structures.

In the present specification, the terms "a", "an", "the", "said" and "at least one" are used to indicate that there are one or more elements/components/etc. The terms "including", "containing" and "having" is used to mean open-ended inclusion, and means that in addition to the listed elements/components/etc., there may be additional elements/components/etc. The terms "first", "second", and "third" are only used as markers, and are not a limitation on the number of objects.

It should be understood that the present disclosure does not limit the present application only to the detailed structure and arrangement of components as proposed in the present specification. The present disclosure is capable of other embodiments, and can be implemented and executed in various ways. The aforementioned deformations and modifications fall within the scope of the present disclosure. It should be understood that the present disclosure disclosed and defined in the present specification extends to all alternative combinations of two or more individual features mentioned or obvious in the text and/or drawings. All these different combinations constitute multiple alternative aspects of the present disclosure. The embodiments described in the present specification illustrate the best way known for implementing the present disclosure, and will enable those skilled in the art to utilize the present disclosure.

The invention claimed is:

1. A display panel, comprising:
an array substrate comprising a plurality of switch units;
a plurality of sub-pixels disposed on the array substrate, wherein each sub-pixel comprises a plurality of light-emitting components, each light-emitting component comprises a driving electrode, the driving electrode is connected to the plurality of switch units, and a gap exists between the driving electrodes of two adjacent light-emitting components;
a plurality of divergent lenses, wherein each divergent lens is disposed on a side of a respective gap away from the array substrate, and an orthographic projection of the gap on the array substrate is located in an orthographic projection of the divergent lens on the array substrate; and
a first planarization layer disposed on a side of the plurality of divergent lenses away from the array substrate,
wherein each sub-pixel further comprises:
a pixel definition layer disposed on a side of the driving electrodes of the plurality of light-emitting components away from the array substrate, wherein a second via hole is provided in the pixel definition layer to expose the driving electrodes of the plurality of light-emitting components;
a light-emitting layer disposed in the second via hole and connected to the driving electrodes of the plurality of light-emitting components:
a second electrode disposed on a side of the light-emitting layer away from the array substrate; and
a group of protective layers disposed on a side of the second electrode away from the array substrate.

2. The display panel according to claim 1, wherein a side of each divergent lens close to the array substrate is a flat surface and a side of each divergent lens away from the array substrate is an arc surface.

3. The display panel according to claim 1, wherein in a thickness direction of the array substrate, a distance between a side of each divergent lens close to a respective driving electrode and a side of the respective driving electrode close to the divergent lens is greater than or equal to a focal length of the divergent lens.

4. The display panel according to claim 3, wherein in the thickness direction of the array substrate, the distance between the side of each divergent lens close to the respective driving electrode and the side of the respective driving electrode close to the divergent lens is less than or equal to twice the focal length of the divergent lens.

5. The display panel according to claim 1, wherein the light-emitting layer comprises a plurality of light-emitting parts and each light-emitting part is connected to the driving electrode of a respective light-emitting component.

6. The display panel according to claim 1, wherein the group of protective layers comprises a group of encapsulation layers.

7. The display panel according to claim 1, wherein an orthographic projection of each gap on the array substrate is located in a middle area of an orthographic projection of a respective divergent lens on the array substrate.

8. The display panel according to claim 1, wherein the array substrate comprises:
a base substrate;
a buffer layer disposed on the base substrate:
an active layer disposed on a side of the buffer layer away from the base substrate;
a gate insulating layer disposed on a side of the active layer away from the base substrate, wherein a third via hole is provided in the gate insulating layer to expose the active layer;
a gate electrode disposed on a side of the gate insulating layer away from the base substrate;
an interlayer dielectric layer disposed on a side of the gate electrode away from the base substrate, wherein a fourth via hole, communicating with the third via hole, is provided in the interlayer dielectric layer;
source and drain electrodes disposed on a side of the interlayer dielectric layer away from the base substrate, and connected to the active layer through the fourth via hole and the third via hole; and
a second planarization layer disposed on a side of the source and drain electrodes away from the base substrate, wherein a plurality of first via holes is provided in the first planarization layer.

9. A manufacturing method for a display panel, comprising:
providing an array substrate, wherein the array substrate comprises a plurality of switch units;
forming a plurality of sub-pixels on the array substrate, wherein each sub-pixel comprises a plurality of light-emitting components, each light-emitting component comprises a driving electrode, the driving electrode is connected to the plurality of switch units, and a gap exists between the driving electrodes of two adjacent light-emitting components;
forming a divergent lens on a side of each gap away from the array substrate, wherein an orthographic projection of the gap on the array substrate is located in an orthographic projection of the divergent lens on the array substrate; and
forming a first planarization layer on a side of the divergent lens away from the array substrate,
wherein each sub-pixel further comprises:
a pixel definition layer disposed on a side of the driving electrodes of the plurality of light-emitting components away from the array substrate, wherein a second via hole is provided in the pixel definition layer to expose the driving electrodes of the plurality of light-emitting components;
a light-emitting layer disposed in the second via hole and connected to the driving electrodes of the plurality of light-emitting components;
a second electrode disposed on a side of the light-emitting layer away from the array substrate; and a group of protective layers disposed on a side of the second electrode away from the array substrate.

10. The manufacturing method according to claim 9, wherein the divergent lens is formed by a nano-imprinting process.

11. A display device, comprising a display panel, wherein the display panel comprises:
an array substrate comprising a plurality of switch units;
a plurality of sub-pixels disposed on the array substrate, wherein each sub-pixel comprises a plurality of light-emitting components, each light-emitting component comprises a driving electrode, the driving electrode is connected to the plurality of switch units, and a gap exists between the driving electrodes of two adjacent light-emitting components;
a plurality of divergent lenses, wherein each divergent lens is disposed on a side of a respective gap away from the array substrate, and an orthographic projection of the gap on the array substrate is located in an orthographic projection of the divergent lens on the array substrate; and
a first planarization layer disposed on a side of the plurality of divergent lenses away from the array substrate,
wherein each sub-pixel further comprises:
a pixel definition layer disposed on a side of the driving electrodes of the plurality of light-emitting components away from the array substrate, wherein a second via hole is provided in the pixel definition layer to expose the driving electrodes of the plurality of light-emitting components;
a light-emitting layer disposed in the second via hole and connected to the driving electrodes of the plurality of light-emitting components;
a second electrode disposed on a side of the light-emitting layer away from the array substrate; and
a group of protective layers disposed on a side of the second electrode away from the array substrate.

12. The display device according to claim 11, wherein a side of each divergent lens close to the array substrate is a flat surface and a side of each divergent lens away from the array substrate is an arc surface.

13. The display device according to claim 11, wherein in a thickness direction of the array substrate, a distance between a side of each divergent lens close to a respective driving electrode and a side of the respective driving electrode close to the divergent lens is greater than or equal to a focal length of the divergent lens.

14. The display device according to claim 13, wherein in the thickness direction of the array substrate, the distance between the side of each divergent lens close to the respective driving electrode and the side of the respective driving electrode close to the divergent lens is less than or equal to twice the focal length of the divergent lens.

15. The display device according to claim 11, wherein the light-emitting layer comprises a plurality of light-emitting parts and each light-emitting part is connected to the driving electrode of a respective light-emitting component.

16. The display device according to claim 11, wherein an orthographic projection of each gap on the array substrate is located in a middle area of an orthographic projection of a respective divergent lens on the array substrate.

* * * * *